United States Patent
Hosoya (10) Patent No.: US 8,709,685 B2
(45) Date of Patent: Apr. 29, 2014

(54) REFLECTIVE MASK BLANK AND METHOD OF MANUFACTURING A REFLECTIVE MASK

(71) Applicant: Hoya Corporation, Tokyo (JP)

(72) Inventor: Morio Hosoya, Tokyo (JP)

(73) Assignee: Hoya Corporation, Tokyo (JP)

(*) Notice: Subject to any disclaimer, the term of this patent is extended or adjusted under 35 U.S.C. 154(b) by 0 days.

(21) Appl. No.: 13/675,169

(22) Filed: Nov. 13, 2012

(65) Prior Publication Data

US 2013/0071779 A1 Mar. 21, 2013

Related U.S. Application Data

(62) Division of application No. 12/761,019, filed on Apr. 15, 2010, now Pat. No. 8,329,361.

(30) Foreign Application Priority Data

Apr. 15, 2009 (JP) ................. 2009-098621

(51) Int. Cl.
G03F 1/24 (2012.01)
G03F 1/22 (2012.01)

(52) U.S. Cl.
USPC .............................................. 430/5

(58) Field of Classification Search
USPC ............... 430/5, 322; 428/209, 210; 378/35
See application file for complete search history.

(56) References Cited

U.S. PATENT DOCUMENTS

| | | |
|---|---|---|
| 2002/0045108 A1 | 4/2002 | Lee et al. |
| 2003/0039923 A1 | 2/2003 | Mangat et al. |
| 2005/0208389 A1 | 9/2005 | Ishibashi et al. |
| 2006/0022961 A1 | 2/2006 | Kaminaga |
| 2008/0182183 A1 | 7/2008 | Hayashi et al. |
| 2008/0199787 A1 | 8/2008 | Hayashi et al. |

FOREIGN PATENT DOCUMENTS

| | | |
|---|---|---|
| JP | 8213303 | 8/1996 |
| JP | 2001-237174 A | 8/2001 |
| JP | 2001237174 | 8/2001 |
| JP | 2002122981 | 4/2002 |
| JP | 2004-006798 A | 1/2004 |
| JP | 2005-516380 A | 6/2005 |
| JP | 2008-535270 A | 8/2008 |
| JP | 2008-244089 A | 10/2008 |
| WO | 2008-093534 A1 | 8/2008 |

OTHER PUBLICATIONS

M. Takahashi, et al, "Smooth, Low-Stress, Sputtered Tantalum and Tantalum Allow Films for the Absorber Material of Reflective-Type EUVL", In Emerging Lithographic Technologies IV, Proceedings of SPIE vol. 3997 (2000), pp. 484-495.

M. Takahashi, et al, "Tantalum Nitride Films for the Absorber Material of Reflective-type EUVL Mask", XP008008080, Proceedings of SPIE vol. 4343 Feb. 2001, pp. 760-770.

Primary Examiner — Stephen Rosasco
(74) Attorney, Agent, or Firm — Sughrue Mion, PLLC (57) ABSTRACT

A reflective mask blank and a reflective mask that can improve the contrast for EUV exposure light in use of the mask and further can improve the pattern resolution at a pattern edge portion of the mask, thereby enabling high-resolution pattern transfer. The reflective mask blank has a substrate and, further, a multilayer reflective film adapted to reflect the EUV exposure light and an absorber film adapted to absorb the EUV exposure light, which are formed in this order over the substrate. The absorber film is made of a material containing Ta and has a film density of 6.0 to 16.0 g/cm$^3$. A reflective mask is obtained by forming a transfer pattern in the absorber film of the reflective mask blank.

9 Claims, 2 Drawing Sheets

REFLECTIVE MASK BLANK AND METHOD OF MANUFACTURING A REFLECTIVE MASK

This is a Divisional of application Ser. No. 12/761,019 filed Apr. 15, 2010, claiming priority based on Japanese Patent Application No. 2009-098621, filed on Apr. 15, 2009, the disclosure of which is incorporated herein in its entirety by reference.

BACKGROUND OF THE INVENTION

This invention relates to an exposure reflective mask for use in the manufacture of semiconductor devices or the like and further relates to a reflective mask blank serving as a base for manufacturing such a reflective mask.

In recent years, with the increase in integration of semiconductor devices, fine patterns exceeding the transfer limit of the photolithography have been required in the semiconductor industry. In view of this, the extreme ultraviolet (EUV) lithography being an exposure technique using EUV light with a shorter wavelength is expected to be promising. Herein, the EUV light represents light in a wavelength band of the soft X-ray region or the vacuum ultraviolet region and, specifically, light having a wavelength of about 0.2 to 100 nm. As a mask for use in the EUV lithography, there is proposed an exposure reflective mask described in, for example, JP-A-H08-213303 (Patent Document 1).

The proposed reflective mask has a multilayer reflective film formed on a substrate and adapted to reflect exposure light, a buffer film formed on the multilayer reflective film, and an absorber film formed in a pattern on the buffer film and adapted to absorb the exposure light. The buffer film is provided between the multilayer reflective film and the absorber film for the purpose of protecting the multilayer reflective film in pattern forming and correcting processes of the absorber film. The exposure light incident on the reflective mask placed in an exposure apparatus (pattern transfer apparatus) is absorbed at a portion where the absorber film is present, but is reflected by the multilayer reflective film at a portion where the absorber film is not present so that a reflected optical image is transferred onto a semiconductor substrate through a reflective optical system.

Disclosure of the Invention

In order to transfer a fine pattern onto a semiconductor substrate or the like with high accuracy by the use of a reflective mask, it is important to improve the mask contrast with respect to exposure light such as EUV light.

For that purpose, it is necessary to improve the performance of absorbing the exposure light in an absorber film to thereby enhance its light-shielding ability. It is also important to suppress the surface reflection for the exposure light on a surface of the absorber film.

Therefore, objects of this invention are firstly to provide a reflective mask blank that can improve the contrast for exposure light when used in the form of a mask and further to provide a reflective mask manufactured by the use of such a reflective mask blank, and secondly to provide a reflective mask blank that can improve the pattern resolution at a pattern edge portion to enable high-resolution pattern transfer and further to provide a reflective mask manufactured by the use of such a reflective mask blank.

In order to achieve the above-mentioned objects, this invention has the following structures.

(Structure 1)

A reflective mask blank for use in EUV lithography using EUV light as exposure light, comprising a substrate, a multilayer reflective film formed over the substrate and adapted to reflect the exposure light, and an absorber film formed over the multilayer reflective film and adapted to absorb the exposure light, wherein the absorber film is made of a material containing tantalum (Ta) and has a film density of 6.0 to 16.0 $g/cm^3$.

According to the reflective mask blank of Structure 1, the film density of the absorber film made of the material containing tantalum (Ta) is in the predetermined range so that it is possible to obtain a reflective mask of which the contrast for the EUV light is improved in use thereof.

(Structure 2)

The reflective mask blank according to Structure 1, wherein the absorber film has a laminated structure comprising an uppermost layer and a lower layer other than the uppermost layer, and wherein the uppermost layer is made of a material containing one of an oxide, a nitride, an oxynitride, and a carbide of tantalum (Ta) and has a film density of 6.0 to 11.0 $g/cm^3$ and the lower layer is made of a material containing tantalum (Ta) and has a film density of 11.0 to 16.0 $g/cm^3$.

According to the reflective mask blank of Structure 2, the absorber film has the laminated structure comprising the uppermost layer and the lower layer other than the uppermost layer, wherein the uppermost layer is made of the material containing one of the oxide, the nitride, the oxynitride, and the carbide of tantalum (Ta) and a selection is made of the material of which the film density is low to allow easy transmission of the EUV light therethrough and wherein the lower layer is made of the material containing tantalum (Ta) and a selection is made particularly of the material of which the film density is high. This makes it possible to suppress the surface reflection for the EUV light at the uppermost layer while ensuring sufficient light-shielding performance for the EUV light mainly at the lower layer. As a result, it is possible to obtain a reflective mask of which the mask contrast for the EUV light is improved.

Further, by setting the film density of the uppermost layer to be lower than that of the lower layer to enhance the transmittance of the EUV light at the uppermost layer, it is possible to increase the interference effect between the EUV light transmitted through the uppermost layer and reflected by the lower layer and the EUV light reflected by the multilayer reflective film, so that it is possible to produce the phase shift effect at a pattern edge portion of the absorber film to thereby improve the pattern resolution at the pattern edge portion. As a result, it is possible to obtain a reflective mask that can achieve high-resolution pattern transfer.

(Structure 3)

The reflective mask blank according to Structure 2, wherein the lower layer of the absorber film further contains at least one element selected from boron (B) and nitrogen (N).

According to the reflective mask blank of Structure 3, the lower layer of the absorber film further contains at least one element selected from boron (B) and nitrogen (N). By containing B, it is possible to further improve the amorphous properties and the surface smoothness of the absorber film. By containing N, it is possible to reduce the film stress of the absorber film and thus to improve the adhesion between the absorber film and a buffer film or the multilayer reflective film under the absorber film.

(Structure 4)

The reflective mask blank according to Structure 2, wherein the uppermost layer of the absorber film further contains boron (B).

According to the reflective mask blank of Structure 4, the uppermost layer of the absorber film further contains boron (B). By containing B, it is possible to further improve the amorphous properties and the surface smoothness of the uppermost layer of the absorber film.

(Structure 5)

The reflective mask blank according to Structure 1, further comprising a buffer film between the multilayer reflective film and the absorber film, wherein the buffer film is made of a material containing a nitride of chromium (Cr) and has a film density of 5.0 to 9.0 g/cm$^3$.

According to the reflective mask blank of Structure 5, in addition to the above-mentioned effects, it is possible to prevent the multilayer reflective film from being damaged due to etching during pattern formation and pattern correction of the absorber film. Since the film density of the buffer film containing the nitride of Cr is 5.0 to 9.0 g/cm$^3$, it is possible to enhance the absorption effect of the buffer film for the EUV light and thus to achieve a reduction in thickness of the absorber film correspondingly. In the EUV lithography, the EUV exposure light is incident at an angle inclined by several degrees from a direction perpendicular to a surface of the multilayer reflective film and, therefore, the line width of a pattern when transferred onto a transfer target (a resist or the like on a semiconductor wafer) is thickened in proportion to the height of the pattern sidewall of the absorber film due to the shadowing effect. Accordingly, if the thickness of the absorber film is reduced, there is exhibited an effect that it is possible to reduce the thickening of the line width of the pattern when transferred onto the transfer target.

(Structure 6)

A reflective mask manufacturing method comprising forming an absorber film pattern, serving as a transfer pattern for a transfer target, in the absorber film of the reflective mask blank according to any one of Structure 1 to 5.

As recited in Structure 6, by manufacturing a reflective mask by the use of the reflective mask blank of any one of Structures 1 to 5, it is possible to obtain the reflective mask that can improve the mask contrast for the EUV light in use thereof and that can achieve high-resolution pattern transfer.

According to this invention, it is possible to provide a reflective mask blank that can improve the mask contrast for EUV exposure light when used in the form of a mask and further to provide a reflective mask manufactured by the use of such a reflective mask blank. Further, according to this invention, it is possible to provide a reflective mask blank that can improve the pattern resolution at a pattern edge portion to enable high-resolution pattern transfer and further to provide a reflective mask manufactured by the use of such a reflective mask blank.

MODE FOR CARRYING OUT THE INVENTION

Hereinbelow, this invention will be described in detail with reference to an embodiment thereof.

First, the structure, constituent materials, and a manufacturing method of a reflective mask blank of this invention will be schematically described.

The reflective mask blank of this invention is a reflective mask blank for use in EUV lithography using EUV light as exposure light and comprises a substrate, a multilayer reflective film formed over the substrate and adapted to reflect the exposure light, and an absorber film formed over the multilayer reflective film and adapted to absorb the exposure light, wherein the absorber film is made of a material containing tantalum (Ta) and has a film density of 6.0 to 16.0 g/cm$^3$.

According to such a reflective mask blank of this invention, the film density of the absorber film made of the material containing tantalum (Ta) is in the above-mentioned predetermined range so that it is possible to obtain the reflective mask blank that can improve the mask contrast for the EUV exposure light when used in the form of a mask, and further to obtain a reflective mask manufactured by the use of such a reflective mask blank.

In this invention, "mask contrast" represents a value defined by contrast (i.e. contrast of a reflective mask for use with EUV light as exposure light)=reflectance ratio=1:(reflectance from multilayer reflective film/reflectance from absorber film).

The absorber film in this invention is made of the material containing tantalum (Ta) and has the film density of 6.0 to 16.0 g/cm$^3$. When giving priority to the absorptance for the EUV exposure light, the film density is preferably in the range of 11.0 to 16.0 g/cm$^3$ and more preferably in the range of 11.5 to 15.5 g/cm$^3$. On the other hand, when giving priority to producing the phase shift effect by allowing transmission of the EUV exposure light to an extent that does not expose a resist of a transfer target, the film density is preferably in the range of 6.0 to 11.0 g/cm$^3$ and more preferably in the range of 7.0 to 9.0 g/cm$^3$. If the film density is less than 6.0 g/cm$^3$, there arises a problem that the absorptance for the EUV exposure light is significantly low so that the need arises to increase the film thickness, thus extremely degrading the pattern resolution. On the other hand, if the film density is higher than 16.0 g/cm$^3$, there arises a problem that the film density is close to the density of pure Ta crystals (16.6 g/cm$^3$) and thus the smoothness of the film is difficult to obtain, and further, the film formation by sputtering is also difficult.

In this invention, particularly Ta alone or a material composed mainly of Ta can be preferably used. The material composed mainly of Ta is, for example, an alloy of Ta. In terms of smoothness and flatness, the absorber film preferably has an amorphous or microcrystalline structure. As the material composed mainly of Ta, it is possible to suitably use, for example, a material containing Ta and B, a material containing Ta and N, or a material containing Ta and B and further containing at least one of O and N. By adding, for example, B to Ta, an amorphous material can be easily obtained to improve the smoothness. On the other hand, by adding N or O to Ta, the resistance to oxidation is improved and therefore there is obtained an effect of improving the temporal stability.

In the case of the film of Ta alone, the film density in the range of 12.3 to 14.5 g/cm$^3$ can be obtained depending on the film forming conditions. In the case of the material containing Ta and B, the film density in the range of 11.0 to 16.0 g/cm$^3$ can be obtained depending on the composition ratio of Ta and B. In the case of the material containing Ta and N, the film density in the range of 12.5 to 13.8 g/cm$^3$ can be obtained depending on the composition ratio of Ta and N. In the case of the material containing Ta, B, and N, the film density in the range of 12.3 to 14.5 g/cm$^3$ can be obtained depending on the composition ratio of Ta, B, and N. Also in the case of these materials, the film density changes depending on the film forming conditions other than on the composition ratio.

In the material composed mainly of Ta, such as the material containing Ta and B, the material containing Ta and N, or the material containing Ta, B, and N, it is not necessary to particularly limit the composition ratio in this invention as long as the film density of the absorber film is in the range of 6.0 to 16.0 g/cm$^3$. However, for example, in terms of the etchability, the composition ratio Ta/B is preferably in the range of 95/5 to 50/50 (at % ratio) in the material containing Ta and B, the composition ratio Ta/N is preferably in the range of 95/5 to 50/50 (at % ratio) in the material containing Ta and N, and, in the material containing Ta, B, and N, when N is 10 to 30 at % and the balance is given as 100, B is preferably 5 to 30 at %.

The absorber film composed of Ta alone or composed mainly of Ta is preferably formed by sputtering such as magnetron sputtering. For example, in the case of the TaBN film, it can be formed by sputtering using a target containing Ta and B and using an argon gas added with nitrogen. In the case of the film formation by sputtering, the film density and the internal stress can be controlled by changing the power and the introducing gas pressure applied to the sputtering target. Further, since the film formation is enabled at a low temperature such as about room temperature, the thermal influence to the multilayer reflective film and so on can be made small.

The absorber film is required to have a thickness that can sufficiently ensure the light-shielding ability with respect to the EUV light as the exposure light, and it is normally about 30 to 100 nm.

In a more preferred embodiment of a reflective mask blank of this invention, the absorber film has a laminated structure comprising an uppermost layer and a lower layer other than the uppermost layer (i.e. the lower layer is provided over the multilayer reflective film and the uppermost layer is provided over the lower layer). The uppermost layer is made of a material containing one of an oxide, a nitride, an oxynitride, and a carbide of tantalum (Ta) and has a film density of 6.0 to 11.0 g/cm$^3$ and the lower layer is made of a material containing tantalum (Ta) and has a film density of 11.0 to 16.0 g/cm$^3$. According to this more preferred embodiment of this invention, there are obtained a reflective mask blank having the following effects and a reflective mask manufactured by the use of such a reflective mask blank.

(1) The absorber film has the laminated structure comprising the uppermost layer and the lower layer other than the uppermost layer, wherein the uppermost layer is made of the material containing one of the oxide, the nitride, the oxynitride, and the carbide of tantalum (Ta) and a selection is made of the material of which the film density is low to allow easy transmission of the EUV exposure light therethrough and wherein the lower layer is made of the material containing tantalum (Ta) and a selection is made particularly of the material of which the film density is high. This makes it possible to suppress the surface reflection for the EUV exposure light at the uppermost layer while ensuring sufficient light-shielding performance for the EUV exposure light mainly at the lower layer. As a result, it is possible to obtain a reflective mask of which the mask contrast for the EUV exposure light is improved. That is, it is possible to suppress the surface reflection by enhancing the exposure light transmittance at the uppermost layer in use of the mask and to improve the mask contrast for the EUV light as the exposure light, so that a fine pattern can be transferred with high accuracy.

(2) By setting the film density of the uppermost layer to be lower than that of the lower layer to enhance the transmittance of the EUV exposure light at the uppermost layer, it is possible to increase the interference effect between the EUV exposure light transmitted through the uppermost layer and reflected by the lower layer and the EUV exposure light reflected by the multilayer reflective film, so that it is possible to produce the phase shift effect at a pattern edge portion of the absorber film to thereby improve the pattern resolution at the pattern edge portion. As a result, it is possible to obtain a reflective mask that can achieve high-resolution pattern transfer.

The uppermost layer of the absorber film in this invention is made of the material containing one of the oxide, the nitride, the oxynitride, and the carbide of tantalum (Ta) and has the film density of 6.0 to 11.0 g/cm$^3$. Particularly preferably, the film density is in the range of 7.0 to 9.0 g/cm$^3$. If the film density is less than 6.0 g/cm$^3$, there arises a problem that the reflection on the interface between the uppermost layer and the lower layer becomes strong and the EUV light can hardly be absorbed so that the contrast cannot be attained. On the other hand, if the film density is higher than 11.0 g/cm$^3$, there arises a problem that the transmittance of the EUV exposure light becomes low, thus reducing the effect of suppressing the surface reflection for the exposure light at the uppermost layer.

As typical compound examples of the oxide, the nitride, the oxynitride, and the carbide of Ta, there can be cited, for example, TaO, TaON, TaN, TaCN, and TaC. The material forming the uppermost layer of the absorber film may further contain boron (B). By containing B, it is possible to further improve the amorphous properties and the surface smoothness of the film. As typical compound examples, there can be cited, for example, TaBO, TaBON, TaBC, and TaBCN.

For example, in the case of the material containing Ta and O (oxide of Ta), the film density in the range of 7.0 to 8.8 g/cm$^3$ can be obtained depending on the composition ratio of Ta and O. In the case of the material containing Ta, B, and O, the film density in the range of 8.5 to 11.0 g/cm$^3$ can be obtained depending on the composition ratio of Ta, B, and O. The film density also changes depending on the film forming conditions other than on the composition ratio.

In the material forming the uppermost layer of the absorber film, it is not necessary to particularly limit the composition ratio in this invention as long as the film density of the uppermost layer is in the range of 6.0 to 11.0 g/cm$^3$. However, for example, in terms of the etchability, the composition ratio Ta/O is preferably in the range of 30/50 to 75/15 (at % ratio) in the material containing Ta and O and, in the material containing Ta, B, and O, when O is 15 to 72 at % and the balance is given as 100, B is preferably 5 to 30 at %. The thickness of the uppermost layer of the absorber film can be set to about 5 to 20 nm, but is preferably optimized for enhancing the transmittance of the EUV exposure light, for example.

The lower layer of the absorber film in this invention is made of the material containing tantalum (Ta) and has the film density of 11.0 to 16.0 g/cm$^3$. Particularly preferably, the film density is in the range of 12.5 to 14.5 g/cm$^3$. If the film density of the lower layer is less than 11.0 g/cm$^3$, there arises a problem that the absorption performance for the EUV exposure light at the lower layer cannot be sufficiently obtained. On the other hand, if the film density is higher than 16.0 g/cm$^3$, there arises a problem that the film density is close to the density of pure Ta crystals (16.6 g/cm$^3$) and thus the smoothness of the film is difficult to obtain, and further, the film formation by sputtering is also difficult.

In this invention, particularly Ta alone or a material composed mainly of Ta can be preferably used. As the material composed mainly of Ta, it is possible to suitably use, for example, a material containing Ta and B, a material containing Ta and N, or a material containing Ta and B and further containing at least one of O and N. As described before, by adding, for example, B to Ta, an amorphous material can be easily obtained to improve the smoothness. On the other hand, by adding N or O to Ta, the resistance to oxidation is improved and therefore there is obtained an effect of improving the temporal stability.

As described before, in the case of the film of Ta alone, the film density in the range of 12.3 to 14.5 g/cm$^3$ can be obtained depending on the film forming conditions. In the case of the material containing Ta and B, the film density in the range of 11.0 to 16.0 g/cm$^3$ can be obtained depending on the composition ratio of Ta and B. In the case of the material containing Ta and N, the film density in the range of 12.5 to 13.8 g/cm$^3$ can be obtained depending on the composition ratio of Ta and N. In the case of the material containing Ta, B, and N, the film density in the range of 12.3 to 14.5 g/cm$^3$ can be obtained depending on the composition ratio of Ta, B, and N.

In the case of using, as the lower layer of the laminated-structure absorber film, the material composed mainly of Ta, such as the material containing Ta and B, the material containing Ta and N, or the material containing Ta, B, and N, it is not necessary to particularly limit the composition ratio in this invention as long as the film density of the lower layer is in the range of 11.0 to 16.0 g/cm$^3$. However, for example, in terms of the etchability, the composition ratio Ta/B is preferably in the range of 95/5 to 70/30 (at % ratio) in the material containing Ta and B, the composition ratio Ta/N is preferably in the range of 90/10 to 50/50 (at % ratio) in the material containing Ta and N, and, in the material containing Ta, B, and N, when N is 10 to 40 at % and the balance is given as 100, B is preferably 5 to 30 at %.

The lower layer of the absorber film is required to have a thickness that can sufficiently ensure the light-shielding ability with respect to, for example, the EUV light as the exposure light, and it is normally about 30 to 100 nm. Also in the case of the laminated-structure absorber film, the uppermost layer and the lower layer are preferably formed by sputtering such as magnetron sputtering. For example, in the case of the TaBN film, it can be formed by sputtering using a target containing Ta and B and using an argon gas added with nitrogen. In the case of the film formation by sputtering, the film density and the internal stress can be controlled by changing the power and the introducing gas pressure applied to the sputtering target. Further, since the film formation is enabled at a low temperature such as about room temperature, the thermal influence to the multilayer reflective film and so on can be made small.

Any of the above-mentioned single-layer absorber film and the uppermost layer and the lower layer of the above-mentioned laminated-structure absorber film does not necessarily have a uniform composition over its entirety and, for example, may have a gradient composition so that the composition changes in a thickness direction of the film. In the gradient composition, the composition of contained elements may change continuously or stepwise.

A buffer film having etching characteristics different from those of the absorber film may be formed between the multilayer reflective film and the absorber film. By forming such a buffer film, the multilayer reflective film is prevented from being damaged due to etching during pattern formation and pattern correction of the absorber film. Particularly, if the buffer film is made of a chromium-based material containing chromium, it can obtain high smoothness and therefore a surface of the absorber film formed thereon can also obtain high smoothness so that pattern blur can be reduced.

In this invention, as the chromium-based material of the buffer film, particularly a material containing a nitride of chromium (Cr) can be preferably cited. The film density of the buffer film is preferably in the range of 5.0 to 9.0 g/cm$^3$. Since the film density of the buffer film containing the nitride of chromium is 5.0 to 9.0 g/cm$^3$, it is possible to enhance the absorption effect of the buffer film for the EUV light and thus to achieve a reduction in thickness of the absorber film. Accordingly, there is exhibited an effect that it is possible to reduce the thickening of the pattern line width which is caused by the shadowing effect when a pattern is transferred onto a transfer target.

Each of the above-mentioned reflective mask blanks may have a resist film to be used for forming a predetermined transfer pattern in the absorber film.

As reflective masks obtained by the use of the above-mentioned reflective mask blanks, the following modes are cited.

(1) A reflective mask having a buffer film formed on a multilayer reflective film formed on a substrate and having an absorber film pattern in the form of a predetermined transfer pattern formed on the buffer film.
(2) A reflective mask having a pattern of a buffer film and an absorber film in the form of a predetermined transfer pattern formed on a multilayer reflective film formed on a substrate.
(3) A reflective mask having an absorber film pattern in the form of a predetermined transfer pattern formed on a multilayer reflective film formed on a substrate.

Referring now to FIGS. 1A to 1D and FIG. 2, the structure of a reflective mask blank of this invention, a manufacturing method of such a reflective mask blank, and a manufacturing method of a reflective mask will be described in detail.

Figure 1A:
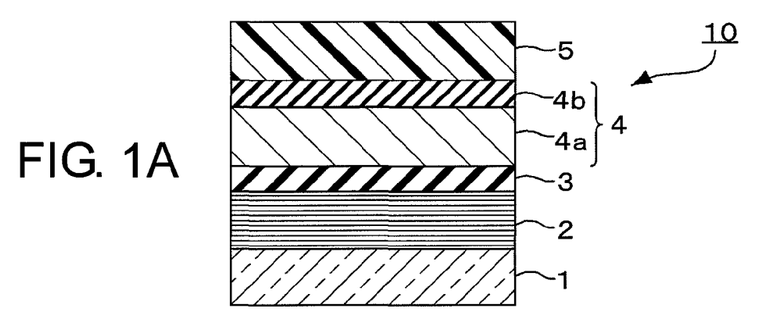
FIGS. 1A to 1D are cross-sectional views showing the structure of a reflective mask blank according to an embodiment of this invention and further showing processes of manufacturing a reflective mask by the use of such a mask blank.
Figure 1B:
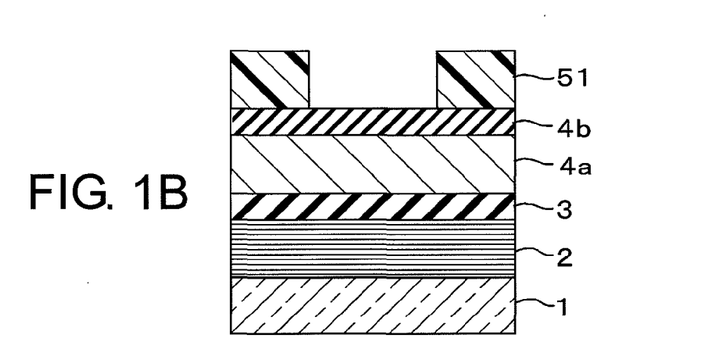

FIGS. 1A to 1D are schematic cross-sectional views showing one embodiment of a reflective mask blank of this invention and further showing processes of manufacturing a reflective mask by the use of this mask blank. As shown in FIG. 1A, according to this embodiment, a reflective mask blank 10 of this invention has a structure in which a multilayer reflective film 2 is formed on a substrate 1, a buffer film 3 is formed on the multilayer reflective film 2, and an absorber film 4 having a laminated structure comprising a lower layer 4a and an uppermost layer 4b laminated in this order is formed on the buffer film 3. A resist film 5 is further provided on an upper surface of the absorber film 4.

In order to prevent pattern deformation due to heat during exposure, the substrate 1 preferably has a low thermal expansion coefficient in the range of 0±1.0×10$^{-7}$/° C. and more preferably in the range of 0±0.3×10$^{-7}$/° C. As a material having a low thermal expansion coefficient in this range, it is possible to use any of an amorphous glass, a ceramic, and a metal. For example, use can be made of a SiO$_2$—TiO$_2$-based glass or a quartz glass in the case of an amorphous glass or of a crystallized glass precipitated with β-quartz solid solution in the case of a crystallized glass. As an example of a metal substrate, an Invar alloy (Fe—Ni-based alloy) or the like can be cited. It is also possible to use a single-crystal silicon substrate.

Further, in order to obtain high reflectance and high transfer accuracy, the substrate 1 preferably has high smoothness and high flatness. Particularly, the substrate 1 preferably has a surface with a smoothness of 0.2 nm or less in Rms (smoothness in a 10 μm square area) and a flatness of 100 nm or less (flatness in a 142 mm square area). Further, the substrate 1 preferably has high rigidity in order to prevent deformation thereof due to the film stress of a film to be formed thereon. Particularly, the substrate 1 preferably has a high Young's modulus of 65 GPa or more.

The unit Rms representing the smoothness is a root mean square roughness which can be measured by, for example, an atomic force microscope. The flatness is a value representing a warp (deformation amount) of a surface given by TIR (Total Indicated Reading) and, assuming that a plane determined by the method of least squares on the basis of a substrate surface is given as a focal plane, the flatness is an absolute value of a height difference between the highest position of the substrate surface located above the focal plane and the lowest position of the substrate surface located below the focal plane.

The multilayer reflective film 2 is a multilayer film in which elements with different refractive indices are periodically laminated and, in general, use is made of a multilayer film in which thin films of a heavy element or its compound and thin films of a light element or its compound are alternately laminated by about 40 to 60 cycles.

For example, as a multilayer reflective film for EUV light having a wavelength of 13 to 14 nm, use is preferably made of a Mo/Si cycle multilayer film in which Mo films and Si films are alternately laminated by about 40 cycles. As other multilayer reflective films for use in the region of the EUV light, there are a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, and so on. The material may be properly selected according to the exposure wavelength.

The multilayer reflective film 2 can be formed by depositing each layer by DC magnetron sputtering, ion beam sputtering, or the like. In the case of the above-mentioned Mo/Si cycle multilayer film, using, for example, the ion beam sputtering, a Si target is first used to form a Si film having a thickness of about several nm, then a Mo target is used to form a Mo film having a thickness of about several nm and, given that this forms one cycle, Si and Mo films are laminated by 40 to 60 cycles and, finally, a Si film is formed. In this invention, a protective film made of a material such as, for example, ruthenium (Ru) or its compound may be provided between the multilayer reflective film 2 and the buffer film 3 or between the multilayer reflective film 2 and the absorber film 4 (in the case of having no buffer film 3). With this protective film, the multilayer reflective film 2 is prevented from being damaged due to etching during pattern formation of the buffer film 3 or the absorber film 4 so that it is possible to prevent a reduction in exposure light reflectance. As the ruthenium compound, RuNb or RuZr can be cited, for example.

As the buffer film 3, the above-mentioned chromium-based buffer film can be preferably used, for example. The buffer film 3 can be formed on the multilayer reflective film 2 by sputtering such as ion beam sputtering other than DC sputtering or RF sputtering. When performing correction of an absorber film pattern by the use of, for example, a focused ion beam (FIB), the thickness of the buffer film 3 is preferably set to about 20 to 60 nm, but when the FIB is not used, it may be set to about 5 to 15 nm.

The absorber film 4 has a function of absorbing, for example, the EUV light as the exposure light and, in the embodiment shown in FIGS. 1A to 1D, has the laminated structure of the lower layer 4a and the uppermost layer 4b. Such an absorber film is as described before.

In the embodiment shown in FIGS. 1A to 1D, the reflective mask blank 10 is configured as described above and thus has the buffer film 3. However, according to a method of forming a pattern of the absorber film 4 or a method of correcting the formed pattern, the buffer film 3 may be omitted.

Now, a description will be given of the processes of manufacturing a reflective mask by the use of the reflective mask blank 10.

The materials and the forming methods of the respective layers of the reflective mask blank 10 (see FIG. 1A) are as described above.

Then, a predetermined transfer pattern is formed in the absorber film 4 of the reflective mask blank 10. First, the resist film 5 (e.g. a known resist for electron beam writing) on the absorber film 4 is subjected to predetermined pattern writing by the use of an electron beam writing apparatus and then to development, thereby forming a predetermined resist pattern 51 (see FIG. 1B).

Figure 1C:
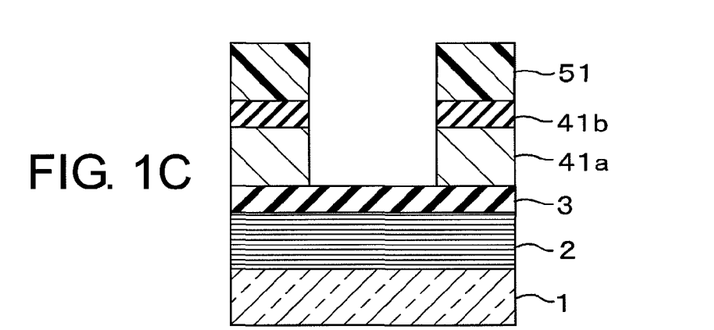

Then, using the formed resist pattern 51 as a mask, the uppermost layer 4b and the lower layer 4a of the absorber film 4 are dry-etched to thereby form an absorber film pattern (a laminated pattern of an uppermost layer pattern 41b and a lower layer pattern 41a) in the shape of the predetermined transfer pattern (see FIG. 1C). In the case where the uppermost layer 4b and the lower layer 4a of the absorber film 4 are each made of a material composed mainly of Ta, it is possible to use dry etching with a chlorine gas or a fluorine-based gas. The resist pattern 51 remaining on the uppermost layer pattern 41b is removed by oxygen plasma ashing, ozone water, or the like.

Normally, an inspection is carried out at this stage to check whether or not the absorber film pattern (the laminated pattern of the lower layer pattern 41a and the uppermost layer pattern 41b) is formed according to a design. The inspection is carried out by causing inspection light to be incident on a mask formed with the absorber film pattern and detecting the inspection light reflected by the uppermost layer pattern 41b and the inspection light reflected by the buffer film 3 exposed due to the removal of the absorber film 4 to thereby observe a contrast therebetween.

If, as a result, there is detected, for example, a pinhole defect (white defect) formed by removal of the absorber film 4 at a portion that should not be removed or an etching insufficient defect (black defect) where the absorber film 4 is not sufficiently removed and thus remains partly due to insufficient etching, correction thereof is carried out. For correcting the pinhole defect, there is, for example, a method of depositing a carbon film or the like in a pinhole by FIB-assisted deposition. On the other hand, for correcting the etching insufficient defect, there is, for example, a method of removing an unnecessary portion by FIB irradiation. In this event, the buffer film 3 serves as a protective film for protecting the multilayer reflective film 2 against the FIB irradiation.

Figure 1D:
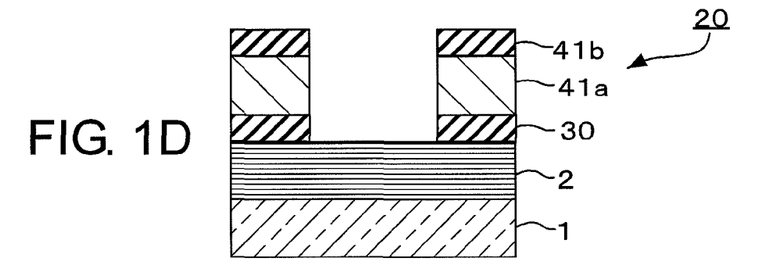

After the pattern inspection and correction have been finished, the exposed buffer film 3 is removed according to the absorber film pattern so as to be formed into a buffer film pattern 30, thereby manufacturing a reflective mask 20 (see FIG. 1D). Herein, for example, in the case where the buffer film 3 is made of a Cr-based material, it is possible to use dry etching with a mixed gas containing chlorine and oxygen. At a portion where the buffer film 3 is removed, the multilayer reflective film 2 is exposed to serve as a reflection area for the exposure light.

If the required reflectance can be obtained without removing the buffer film 3, the buffer film 3 may be left on the multilayer reflective film 2 without being processed into the buffer film pattern 30 according to the absorber film pattern.

Lastly, an inspection is carried out to finally confirm whether or not the absorber film pattern is formed with dimensional accuracy according to a specification.

A reflective mask manufactured by the use of a reflective mask blank of this invention is particularly suitable for the EUV lithography using the EUV light (wavelength: about 0.2 to 100 nm) as exposure light, but is also applicable to other short-wavelength exposure light.

EXAMPLES

Hereinbelow, the embodiment of this invention will be described in further detail in terms of Examples.

Example 1

Use was made of a $SiO_2$—$TiO_2$-based glass substrate (6-inch (152.4 mm) square; thickness: 6.3 mm). This glass substrate had a thermal expansion coefficient of $0.2 \times 10^{-7}$/° C. and a Young's modulus of 67 GPa. The glass substrate had a surface with a smoothness of 0.2 nm or less in Rms and a flatness of 100 nm or less by mechanical polishing.

As a multilayer reflective film formed on the substrate, a Mo film/Si film cycle multilayer reflective film was employed so as to obtain the multilayer reflective film suitable for an exposure light wavelength band of 13 to 14 nm. That is, the multilayer reflective film was formed by using a Mo target and a Si target and alternately laminating Mo films and Si films on the substrate by ion beam sputtering. First, a Si film was deposited to a thickness of 4.2 nm by the use of the Si target, then a Mo film was deposited to a thickness of 2.8 nm by the use of the Mo target and, given that this formed one cycle, films were laminated by 40 cycles, then a Si film was deposited to a thickness of 4.2 nm, and then a Ru film was further deposited to a thickness of 2.5 nm as a protective film on the Si film. In this manner, a multilayer reflective film coated substrate was obtained. Reflectance was measured by applying EUV light of 13.5 nm to the multilayer reflective film at an incident angle of 6.0 degrees and it was 63%.

Then, a buffer film was formed on the protective film of the multilayer reflective film coated substrate thus obtained. As the buffer film, a chromium nitride film was deposited to a thickness of 20 nm. The buffer film was formed by DC magnetron sputtering using a Cr target and using a mixed gas of argon (Ar) and nitrogen ($N_2$) as a sputtering gas. In the formed CrNx film, nitrogen (N) was 10 at % (x=0.1). The film density of the formed CrNx film was 7.0 g/cm$^3$. The film density was measured by the low-angle EUV reflected light intensity measurement.

Then, on the buffer film, a material containing Ta, B, and N was deposited to a thickness of 50 nm as a lower layer of an absorber film. That is, the lower layer of the absorber film was formed by DC magnetron sputtering using a target containing Ta and B and adding nitrogen ($N_2$) in an amount of 10% to argon (Ar). The composition ratio of the formed TaBN film was such that Ta was 59 at %, B was 21 at %, and N was 20 at %.

Subsequently, a material containing Ta, B, and O was deposited to a thickness of 20 nm as an uppermost layer of the absorber film. That is, the uppermost layer of the absorber film was formed by DC magnetron sputtering using a target containing Ta and B and adding oxygen ($O_2$) in an amount of 10% to argon (Ar). The composition ratio of the formed TaBO film was such that Ta was 43 at %, B was 8 at %, and O was 49 at %.

The film density of the formed TaBN film (lower layer) was 13.5 g/cm$^3$ and the film density of the formed TaBO film (uppermost layer) was 9.2 g/cm$^3$. The film density was measured by the above-mentioned low-angle EUV reflected light intensity measurement.

Transmittance was measured by applying EUV light of 13.5 nm to the TaBO film, i.e. the uppermost layer, at an incident angle of 6.0 degrees and it was 0.8%.

In the manner as described above, a reflective mask blank of this Example was manufactured.

Then, using this reflective mask blank, an EUV exposure reflective mask having a pattern satisfying the design rule for the DRAM hp32nm generation was manufactured in the following manner.

First, a resist film for electron beam writing was coated on the reflective mask blank, then predetermined pattern writing was carried out by the use of an electron beam writing apparatus, and then development was carried out after the pattern writing, thereby forming a resist pattern.

Then, using this resist pattern as a mask, the uppermost layer and the lower layer of the absorber film were dry-etched with a chlorine gas, thereby forming the absorber film into a transfer pattern in the form of a laminated pattern of the lower layer and the uppermost layer.

Then, using the absorber film pattern as a mask, dry etching was applied to the buffer film by the use of a mixed gas of chlorine and oxygen to remove the buffer film remaining in a reflection area (portion with no absorber film pattern), thereby exposing the multilayer reflective film having the Ru protective film at its surface to obtain a reflective mask.

A final confirmation inspection of the obtained reflective mask was carried out and it was confirmed that the pattern satisfying the design rule for the DRAM hp32nm generation was formed according to a design. Further, the reflectance of EUV light in the reflection area hardly changed as compared with the reflectance measured in the form of the multilayer reflective film coated substrate and it was 61.8%.

Figure 2:
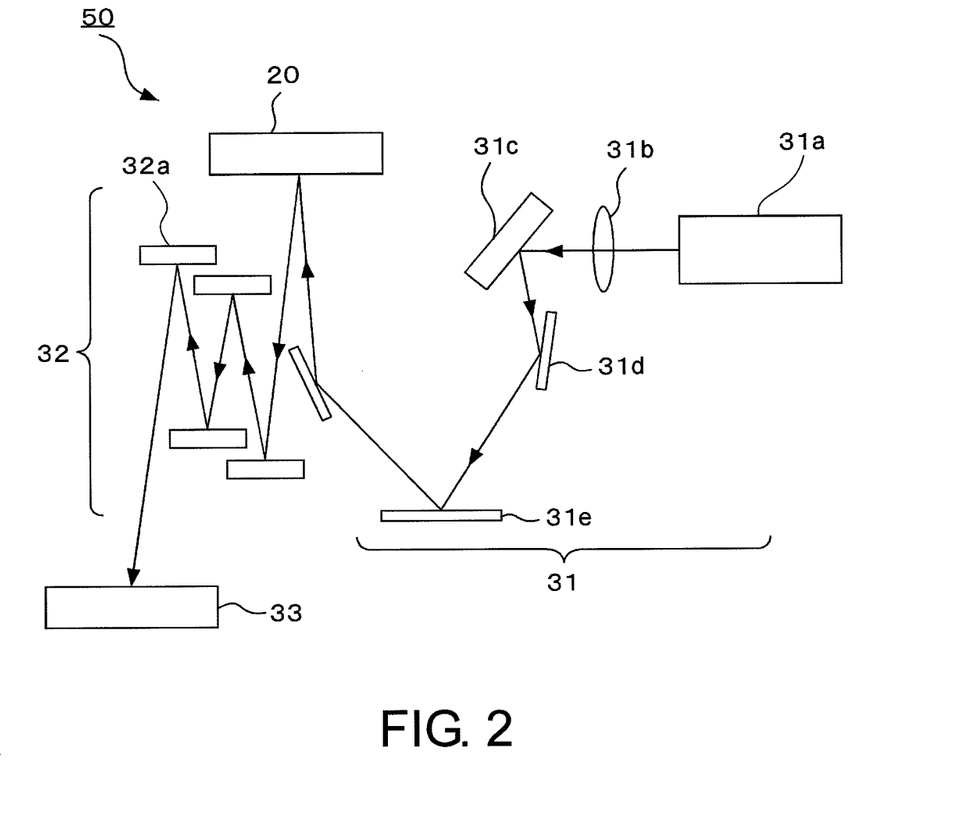
FIG. 2 is a diagram showing a schematic structure of a pattern transfer apparatus with a reflective mask mounted therein.

Then, using the obtained reflective mask of this Example, pattern transfer onto a semiconductor substrate was carried out with EUV light by the use of a pattern transfer apparatus 50 shown in FIG. 2.

The pattern transfer apparatus 50 with the reflective mask 20 mounted therein is roughly formed by a laser plasma X-ray source 31, a reduction optical system 32, and so on. The laser plasma X-ray source 31 comprises a laser light source 31a, a lens 31b for converging laser light emitted from the laser light source 31a, a target 31c for condensing/reflecting an X-ray (EUV light) radiated by the incidence of the laser light, converged by the lens 31b, into a Xe plasma, and mirrors 31d and 31e for reflecting and guiding the EUV light to the reduction optical system 32. The reduction optical system 32 uses a plurality of EUV light reflecting mirrors 32a in FIG. 2. A pattern reflected from the reflective mask 20 is normally reduced in size to about a quarter through the reduction optical system 32. Since a wavelength band of 13 to 14 nm was used as an exposure wavelength, it was set in advance that an optical path was located in a vacuum.

In this state, the EUV light obtained from the laser plasma X-ray source 31 was incident on the reflective mask 20 and the light reflected therefrom was transferred onto a silicon wafer (resist layer coated semiconductor substrate) 33 through the reduction optical system 32.

The light incident on the reflective mask 20 is absorbed by the absorber film and thus is not reflected at a portion where the absorber film pattern is present, while it is reflected by the multilayer reflective film at a portion where the absorber film pattern is not present. In this manner, an image formed by the light reflected from the reflective mask 20 enters the reduction optical system 32. The exposure light through the reduction optical system 32 exposes a transfer pattern onto a resist layer of the silicon wafer 33. Then, by developing the exposed resist layer, a resist pattern is formed on the silicon wafer 33.

The pattern transfer onto the semiconductor substrate was carried out in the manner as described above and it was confirmed that the mask contrast of the reflective mask of this Example was as high as 1:1000 and that the mask accuracy thereof was 3.8 nm or less being an accuracy required by the design rule for the DRAM hp32nm generation.

Example 2

A multilayer reflective film coated substrate was manufactured in the same manner as in Example 1 and, on a Ru protective film thereof, a buffer film in the form of a chromium nitride film was formed in the same manner as in Example 1. The film density of the formed CrNx film was 7.0 g/cm$^3$.

Then, on the buffer film, a material containing Ta and N was deposited to a thickness of 60 nm as a lower layer of an absorber film. That is, the lower layer of the absorber film was formed by DC magnetron sputtering using a Ta target and adding nitrogen ($N_2$) in an amount of 10% to argon (Ar). The composition ratio of the formed TaN film was such that Ta was 78 at % and N was 22 at %.

Subsequently, a material containing Ta and O was deposited to a thickness of 20 nm as an uppermost layer of the absorber film. That is, the uppermost layer of the absorber film was formed by DC magnetron sputtering using a Ta target and adding oxygen ($O_2$) in an amount of 10% to argon (Ar). The composition ratio of the formed TaO film was such that Ta was 55 at % and O was 45 at %.

The film density of the formed TaN film (lower layer) was 14.2 g/cm$^3$ and the film density of the formed TaO film (uppermost layer) was 8.5 g/cm$^3$.

Transmittance was measured by applying EUV light of 13.5 nm to the TaO film, i.e. the uppermost layer, at an incident angle of 6.0 degrees and it was 0.65%.

In the manner as described above, a reflective mask blank of this Example was manufactured.

Then, using this reflective mask blank, an EUV exposure reflective mask having a pattern satisfying the design rule for the DRAM hp32nm generation was manufactured in the same manner as in Example 1.

A final confirmation inspection of the obtained reflective mask was carried out and it was confirmed that the pattern satisfying the design rule for the DRAM hp32nm generation was formed according to a design. Further, the reflectance of EUV light in a reflection area hardly changed as compared with that measured in the form of the multilayer reflective film coated substrate and it was 61.5%.

Then, using the obtained reflective mask of this Example, pattern transfer onto a semiconductor substrate was carried out with EUV light by the use of the pattern transfer apparatus shown in FIG. 2 in the same manner as in Example 1. As a result, it was confirmed that the mask contrast of the reflective mask of this Example was as high as 1:1000 and that the mask accuracy thereof was 3.8 nm or less being an accuracy required by the design rule for the DRAM hp32nm generation.

Example 3

A multilayer reflective film coated substrate was manufactured in the same manner as in Example 1 and, on a Ru protective film thereof, a buffer film in the form of a chromium nitride film was formed in the same manner as in Example 1. The film density of the formed CrNx film was 7.0 g/cm$^3$.

Then, on the buffer film, a Ta film was deposited to a thickness of 50 nm as a lower layer of an absorber film. That is, the lower layer of the absorber film was formed by DC magnetron sputtering using a Ta target in an argon (Ar) gas.

Subsequently, a material containing Ta and O was deposited to a thickness of 20 nm as an uppermost layer of the absorber film. That is, the uppermost layer of the absorber film was formed by DC magnetron sputtering using a Ta target and adding oxygen ($O_2$) in an amount of 10% to argon (Ar). The composition ratio of the formed TaO film was such that Ta was 55 at % and O was 45 at %.

The film density of the formed Ta film (lower layer) was 14.4 g/cm$^3$ and the film density of the formed TaO film (uppermost layer) was 8.5 g/cm$^3$.

Transmittance was measured by applying EUV light of 13.5 nm to the TaO film, i.e. the uppermost layer, at an incident angle of 6.0 degrees and it was 0.78%.

In the manner as described above, a reflective mask blank of this Example was manufactured.

Then, using this reflective mask blank, an EUV exposure reflective mask having a pattern satisfying the design rule for the DRAM hp32nm generation was manufactured in the same manner as in Example 1.

A final confirmation inspection of the obtained reflective mask was carried out and it was confirmed that the pattern satisfying the design rule for the DRAM hp32nm generation was formed according to a design. Further, the reflectance of EUV light in a reflection area hardly changed as compared with that measured in the form of the multilayer reflective film coated substrate and it was 61.7%.

Then, using the obtained reflective mask of this Example, pattern transfer onto a semiconductor substrate was carried out with EUV light by the use of the pattern transfer apparatus shown in FIG. 2 in the same manner as in Example 1. As a result, it was confirmed that the mask contrast of the reflective mask of this Example was as high as 1:1000 and that the mask accuracy thereof was 3.8 nm or less being an accuracy required by the design rule for the DRAM hp32nm generation.

Example 4

A multilayer reflective film coated substrate was manufactured in the same manner as in Example 1 and, on a Ru protective film thereof, a buffer film in the form of a chromium nitride film was formed in the same manner as in Example 1. The film density of the formed CrNx film was 7.0 g/cm$^3$.

Then, on the buffer film, a material containing Ta, B, and N was deposited to a thickness of 70 nm as an absorber film. That is, the absorber film was formed by DC magnetron sputtering using a target containing Ta and B and adding nitrogen ($N_2$) in an amount of 10% to argon (Ar). The composition ratio of the formed TaBN film was such that Ta was 59 at %, B was 21 at %, and N was 20 at %.

The film density of the formed TaBN film was 13.5 g/cm³.

In the manner as described above, a reflective mask blank of this Example was manufactured.

Then, using this reflective mask blank, an EUV exposure reflective mask having a pattern satisfying the design rule for the DRAM hp32nm generation was manufactured in the same manner as in Example 1.

A final confirmation inspection of the obtained reflective mask was carried out and it was confirmed that the pattern satisfying the design rule for the DRAM hp32nm generation was formed according to a design. Further, the reflectance of EUV light in a reflection area hardly changed as compared with that measured in the form of the multilayer reflective film coated substrate and it was 61.8%.

Then, using the obtained reflective mask of this Example, pattern transfer onto a semiconductor substrate was carried out with EUV light by the use of the pattern transfer apparatus shown in FIG. 2 in the same manner as in Example 1. As a result, it was confirmed that the mask contrast of the reflective mask of this Example was as high as 1:1000 and that the mask accuracy thereof was 3.8 nm or less being an accuracy required by the design rule for the DRAM hp32nm generation.

What is claimed is:

1. A reflective mask blank for use in EUV lithography using EUV light as exposure light, comprising a substrate, a multilayer reflective film formed over said substrate and adapted to reflect the exposure light, and an absorber film formed over said multilayer reflective film and adapted to absorb the exposure light,
    wherein said absorber film is made of a material containing tantalum (Ta) and has a film density of 6.0 to 16.0 g/cm³,
    said absorber film has a laminated structure comprising an uppermost layer and a lower layer other than said uppermost layer,
    said uppermost layer is made of a material containing tantalum (Ta) and oxygen (O),
    said lower layer is made of a material containing tantalum (Ta) and nitrogen (N), and
    said uppermost layer has a film density smaller than that of said lower layer.

2. The reflective mask blank according to claim 1,
    wherein said uppermost layer has a film density of 6.0 to 11.0 g/cm³, and said lower layer has a film density of 11.0 to 16.0 g/cm³.

3. The reflective mask blank according to claim 1,
    wherein said uppermost layer is made of a material selected from a group comprising TaO, TaON, TaBO, TaBON, and said lower layer is made of a material selected from a group comprising TaN, TaCN, TaBN, TaBCN.

4. The reflective mask blank according to claim 1,
    wherein said lower layer is made of TaN and has a film density of 12.5 to 13.8 g/cm³.

5. The reflective mask blank according to claim 1,
    wherein said uppermost layer is made of TaO and has a film density of 7.0 to 8.8 g/cm³.

6. The reflective mask blank according to claim 1,
    wherein said lower layer is made of TaBN and has a film density of 12.3 to 14.5 g/cm³.

7. The reflective mask blank according to claim 1,
    wherein said uppermost layer is made of TaBO and has a film density of 8.5 to 11.0 g/cm³.

8. The reflective mask blank according to claim 1, further comprising a buffer film between said multilayer reflective film and said absorber film, wherein said buffer film is made of a material containing a nitride of chromium (Cr) and has a film density of 5.0 to 9.0 g/cm³.

9. A reflective mask manufacturing method comprising forming an absorber film pattern, serving as a transfer pattern for a transfer target, in said absorber film of the reflective mask blank according to claim 1.

* * * * *